United States Patent
Katagiri

(10) Patent No.: US 7,710,790 B2
(45) Date of Patent: May 4, 2010

(54) SEMICONDUCTOR MEMORY DEVICE AND WRITE CONTROL METHOD THEREOF

(75) Inventor: Satoshi Katagiri, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 162 days.

(21) Appl. No.: 12/116,580

(22) Filed: May 7, 2008

(65) Prior Publication Data

US 2008/0278997 A1 Nov. 13, 2008

(30) Foreign Application Priority Data

May 8, 2007 (JP) ............................. 2007-123067

(51) Int. Cl.
*G11C 7/10* (2006.01)
(52) U.S. Cl. ........................... 365/189.04; 365/189.16; 365/233.1; 365/233.11; 365/233.14
(58) Field of Classification Search ............ 365/189.04, 365/189.16, 233.1, 233.11, 233.14
See application file for complete search history.

(56) References Cited

U.S. PATENT DOCUMENTS

2003/0123297 A1* 7/2003 Ohshima et al. ....... 365/189.05

FOREIGN PATENT DOCUMENTS

| JP | 2005-158199 A | 6/2005 |
|---|---|---|
| JP | 2006-24355 A | 1/2006 |

* cited by examiner

*Primary Examiner*—Thong Q Le
(74) *Attorney, Agent, or Firm*—Sughrue Mion, PLLC

(57) ABSTRACT

A semiconductor memory device comprise a word line, a bit line intersecting the word line, a memory element arranged at intersections of the word line and the bit line and having different required time for a write operation according to a logical value of write data, a write driver supplying a write current to the bit line, a write control circuit controlling operations of the write driver, and a timing signal generation circuit supplying a timing signal to the write control circuit. The timing signal has a waveform including a pulse indicating a time of starting supplying the write current when a first logical level is to be written, a pulse indicating a time of ending supplying the write current if the first logical level is to be written, and a pulse indicating one of a time of starting supplying the write current and a time of ending supplying the write current when a second logical level is to be written.

14 Claims, 16 Drawing Sheets

SEMICONDUCTOR MEMORY DEVICE AND WRITE CONTROL METHOD THEREOF

TECHNICAL FIELD

The present invention relates to a semiconductor memory device and a write control method thereof, and, more particularly to a semiconductor memory device having a write time difference according to a logical level of data to be written and a write control method for the semiconductor memory device.

In personal computers or servers, hierarchically constructed various storage devices are used. A lower-hierarchical storage device is required to be low price and has a large capacity, while a higher-hierarchical one is required to be capable of high-speed access. As a lowest-hierarchical storage device, a magnetic storage such as a hard disk drive and a magnetic tape is generally used. The magnetic storage is nonvolatile and capable of saving a considerably large amount of data at a lower price as compared to a semiconductor memory device or the like. However, the magnetic storage is slow in access speed, and does not have random accessibility in many cases. Therefore, a program or data to be saved for a long period is stored in the magnetic storage, and is optionally transferred to a higher-hierarchical storage device when needed.

A main memory is a storage device higher in hierarchy than the magnetic storage. Generally, a DRAM (Dynamic Random Access Memory) is used for the main memory. The DRAM can be accessed at higher speed as compared to the magnetic storage, and in addition, the DRAM has the random accessibility. Further, the DRAM has a characteristic that a cost-per-bit is lower in price than a high-speed semiconductor memory such as an SRAM (Static Random Access Memory).

A highest-hierarchical storage device is an internal cache memory included in an MPU (Micro Processing Unit). The internal cache memory is connected via an internal bus to a core of the MPU, and thus, it can be accessed at remarkably high speed. However, a recording capacity to be secured is considerably small. As a storage device that configures a hierarchy between the internal cache and the main memory, a secondary cache, or a tertiary cache, or the like is used occasionally.

The reason that the DRAM is selected as the main memory is that it has a very good balance between the access speed and the cost-per-bit. Further, the DRAM has a large capacity among the semiconductor memories, and recently, a chip with a capacity of 1 gigabit or more has been developed. However, the DRAM is a volatile memory, and stored data is lost when the power is turned off. Thus, the DRAM is not suitable for a program or data to be save for a long period. In the DRAM, a refresh operation needs to be periodically performed to save the data even while the power supply is turned on. Thus, there is a limit to reduction in power consumption, and there is a problem that complicated control by a controller is needed.

As a nonvolatile semiconductor memory of large capacity, a flash memory is known. However, the flash memory has disadvantages in that a large amount of electricity is needed to write and delete the data, and a writing time and a deleting time are very long. Accordingly, it is not appropriate to replace the DRAM as the main memory. Though other nonvolatile memories including an MRAM (Magnetoresistive Random Access Memory), an FRAM (Ferroelectric Random Access memory) or the like have been proposed, it is difficult to obtain a storage capacity equal to that of the DRAM.

On the other hand, as a semiconductor memory that replaces the DRAM, a PRAM (Phase change Random Access Memory) in which a phase change material is used to record is proposed (see Japanese Patent Application Laid Open Nos. 2006-24355 and 2005-158199, and U.S. Pat. No. 5,536,947). In the PRAM, the data is stored by a phase state of the phase change material included in a recording layer. That is, the phase change material differs greatly in electrical resistance between a crystalline phase and an amorphous phase. The data can be stored by using this characteristic.

The phase state can be changed by applying a write current to the phase change material, which heats the phase change material. Data-reading is performed by applying a read current to the phase change material and sensing the resistance value. The read current is set to a value sufficiently small as compared to the write current so that no phase change occurs. Thus, the phase state of the phase change material does not change unless a high heat is applied thereto, and accordingly, even when the power is turned off, the data is not lost.

To make the phase change material amorphous (the reset operation), it is necessary to heat the phase change material to a temperature equal to or higher than a melting point and to then rapidly quenching the phase change material. On the other hand, to crystallize the phase change material (the set operation), it is necessary to heat the phase change material to a temperature equal to or higher than a crystallization temperature and lower than the melting point by applying the write current to the phase change material, and to then gradually cool the phase change material. Due to this, the PRAM is characterized in that it takes longer time to perform the set operation than the reset operation.

As can be understood, the PRAM is characterized such that there is a great difference between the time necessary to perform the set operation and that necessary to perform the reset operation. As a result, complicated control is disadvantageously required during the data write operation and it is disadvantageously difficult to ensure compatibility with the other general-purpose memory such as a DRAM. Not only the PRAM but also semiconductor memory devices that require different time for the write operation according to a logical value of data to be written (hereinafter, "write data") are confronted with these disadvantages.

SUMMARY OF THE INVENTION

The present invention has been achieved to solve the above problems, and an object of the present invention is to simplify a control over a semiconductor memory device that requires different time for a write operation according to a logical value of write data.

The above and other objects of the present invention can be accomplished by a semiconductor memory device comprising: a word line; a bit line intersecting the word line; a memory element arranged at intersections of the word line and the bit line and having different required time for a write operation according to a logical value of write data; a write driver supplying a write current to the bit line; a write control circuit controlling operations of the write driver; and a timing signal generation circuit supplying a timing signal to the write control circuit, wherein the timing signal has a waveform including a pulse indicating a time of starting supplying the write current when a first logical level is to be written, a pulse indicating a time of ending supplying the write current when the first logical level is to be written, and a pulse indicating one of a time of starting supplying the write current and a time of ending supplying the write current when a second logical level is to be written.

The above and other objects of the present invention can also be accomplished by a write control method for a semiconductor memory device, the semiconductor memory device including a word line, a bit line intersecting the word line, a memory element arranged at intersections of the word line and the bit line and having different required time for a write operation according to a logical value of write data, a first and a second transistor supplying a write current to the bit line, the write control method comprising steps of: generating a timing signal having a first to a third pulse; bringing the first transistor into a conductive state over a period from the first pulse to the third pulse when the first logical level is to be written, and bringing the second transistor into a conductive state over a period from the first pulse to the second pulse when the second logical level is to be written.

According to the present invention, the timing signal indicating a time of starting and ending of write operation of the first and second logical level being used, and the write current being supplied in synchronization with the timing signal, it becomes possible to simplify the write control over the semiconductor memory device having different required time for a write operation according to a logical value of write data. It is thereby possible for the outer apparatus to write data to the semiconductor memory device without regard to a logical value of the data and it becomes easier to ensure compatibility of the semiconductor memory device with a synchronous DRAM.

The present invention can be applied to not only PRAM but also other kind of semiconductor memory device using a variable resistance element in which the resistance value can be changed by applying a voltage pulse, such as a RRAM (Resistance Random Access Memory).

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
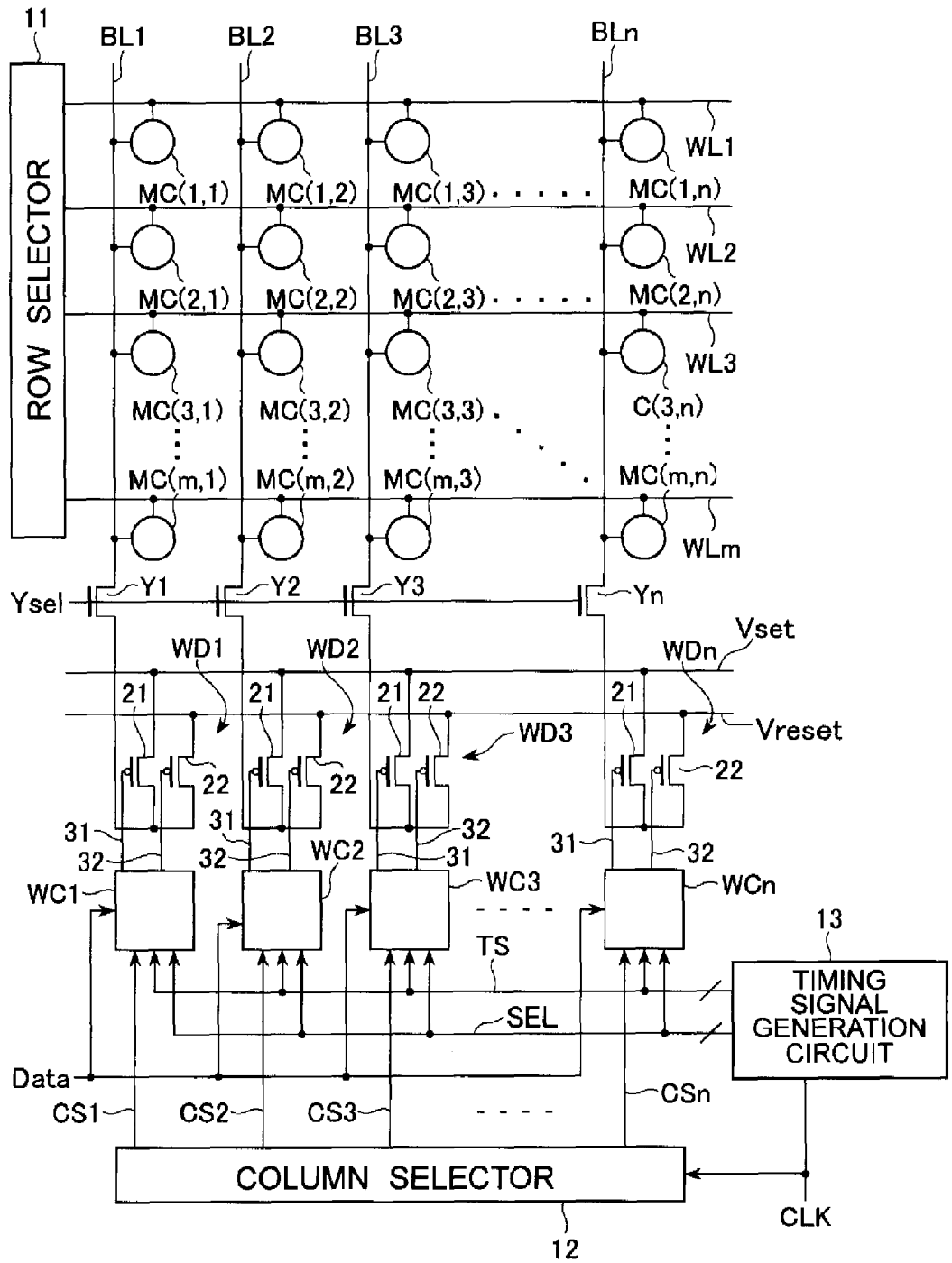
FIG. 1 is a circuit diagram of a semiconductor memory device according to the preferred embodiment of the present invention.

FIG. 1 is a circuit diagram of a semiconductor memory device according to the preferred embodiment of the present invention.

The semiconductor memory device shown in FIG. 1 is a matrix memory including word lines WL1 to WLm, bit lines BL1 to BLn intersecting the word lines WL1 to WLm, memory cells MC (1, 1) to MC (m, n) arranged at intersecting points between the word lines WL1 to WLm and the bit lines BL1 to BLn.

A row selector 11 selects one of the word lines WL1 to WLm and activates the selected word line WL. Write drivers WD1 to WDn are connected to the bit lines BL1 to BLn and supply electric current to the bit lines BL1 to BLn, respectively. Operations performed by the write drivers WD1 to WDn are controlled by write control circuits WC1 to WCn, respectively. As shown in FIG. 1, write data 'Data' is supplied to the write control circuits WC1 to WCn in common.

A column selector 12 is a circuit generating column selection signals CS1 to CSn corresponding to the write control circuits WC1 to WCn, respectively. One of the write control circuits WC1 to WCn is selected by one of the column selection signals CS1 to CSn. A clock signal CLK is supplied to the column selector 12, and the column selector 12 thereby operates synchronously with the clock signal CLK.

As shown in FIG. 1, each of the write drivers WD1 to WDn is configured to include a set transistor 21 and a reset transistor 22. Each of the transistors 21 and 22 is a P channel MOS transistor. A source of the set transistor 21 is connected to a set potential line Vset and that of the reset transistor 22 is connected to a reset potential line Vreset. Drains of the transistors 21 and 22 are connected to one corresponding bit line out of the bit lines BL1 to BLn via one corresponding switch out of Y switches Y1 to Yn in common. A selection signal Ysel is supplied to the Y switches Y1 to Yn in common.

By so configuring, when the set transistor 21 is turned on in a state in which the selection signal Ysel is activated, a set current is supplied to one corresponding bit line out of the bit lines BL1 to BLn. On the other hand, when the reset transistor 22 is turned on in the state in which the selection signal Ysel is activated, a reset current is supplied to one corresponding bit line out of the bit lines BL1 to BLn.

A set pulse 31 supplied to a gate of the set transistor 21 and a reset pulse 32 supplied to a gate of the reset transistor 22 are generated by one corresponding write control circuit out of the write control circuits WC1 to WCn.

As shown in FIG. 1, a timing signal TS and a timing selection signal SEL generated by a timing signal generation circuit 13 as well as the write data 'Data' and the column selection signals CS1 to CSn are supplied to the write control circuits WC1 to WCn. Among these signals, the write data 'Data', the timing signal TS, and the timing selection signal SEL are supplied to the write control circuits WC1 to WCn in common. The column selection signals CS1 to CSn are individually supplied to the respective write control circuits WC1 to WCn.

The timing signal TS includes five timing signals TS1 to TS5 and the timing selection signal SEL includes five timing selection signals SELL to SEL5.

Figure 2:
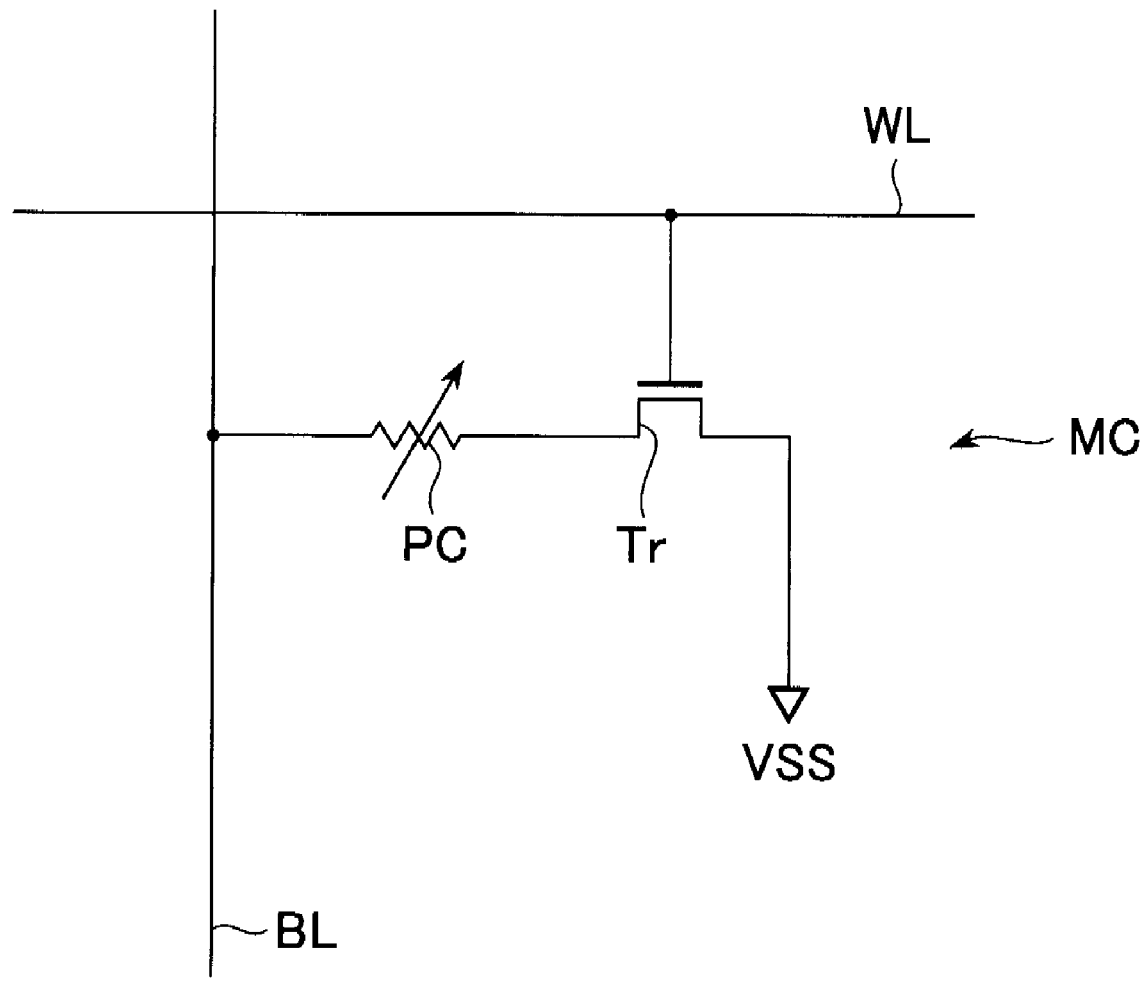
FIG. 2 a circuit diagram of each of the memory cells MCs if the semiconductor memory device according to the present invention is a PRAM.

FIG. 2 is a circuit diagram of each of the memory cells MCs if the semiconductor memory device according to the present invention is a PRAM.

As shown in FIG. 2, if the semiconductor memory device according to the present invention is the PRAM, then each memory cell MC is configured to include a nonvolatile memory element PC made of the phase change material and a selection transistor Tr, and the memory element PC and the selection transistor Tr are connected in series between one bit line BL and one source potential VSS.

The phase change material constituting the nonvolatile memory element PC is not limited to a specific one as long as the material has two or more phase states and has different electric resistances according to the respective phase states. It is preferable to select a so-called chalcogenide material. Examples of the chalcogenide material include alloys each containing at least one element such as germanium (Ge), antimony (Sb), tellurium (Te), indium (In), and selenium (Se) More specifically, examples of the alloys include two-element alloys such as GaSb, InSb, InSe, $Sb_2Te_3$, and GeTe, three-element alloys such as $Ge_2Sb_2Te_5$, InSbTe, GaSeTe, $SnSb_2Te_4$, and InSbGe, and four-element alloys such as AgInSbTe, (GeSn) SbTe, GeSb (SeTe), and $Te_{81}Ge_{15}Sb_2S_2$.

The phase change material containing the chalcogenide material can be turned into a state of either the amorphous phase or the crystal phase. The phase change material in the amorphous phase is in a relatively high resistance state and that in the crystal phase is in a relatively low resistance state.

The selection transistor Tr is configured by an N channel MOS transistor and a gate electrode of the selection transistor Tr is connected to the corresponding word line WL. By so configuring, when the word line WL is activated, the nonvolatile memory element PC is connected between one bit line BL and the source potential VSS.

Figure 3:
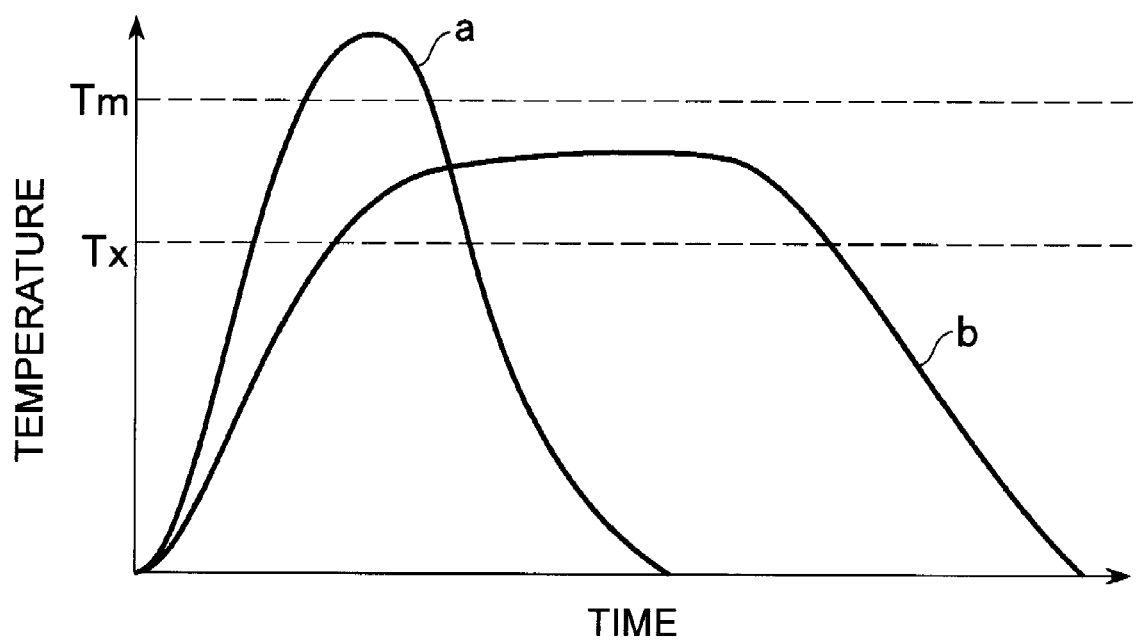
FIG. 3 is a graph for explaining the method to control the phase state of a phase change material e.g. a chalcogenide material.

As described above, to make the phase change material amorphous (the reset operation), it is necessary to heat the phase change material to the temperature equal to or higher than the melting point by application of the write current and to then rapidly quench the phase change material. On the other hand, to crystallize the phase change material (the set operation), it is necessary to heat the phase change material to the temperature equal to or higher than the crystallization temperature and lower than the melting point by application of the write current and to then gradually cool the phase change material. FIG. 3 is a graph for explaining the reset and set operations. In FIG. 3, a curve 'a' indicates a heating method if the phase change material constituting the nonvolatile memory element PC is made amorphous (reset), and a curve 'b' indicates a heating method if the phase change material constituting the nonvolatile memory element PC is crystallized (set).

As shown in FIG. 3, the PRAM requires longer time for the set operation than that for the reset operation.

Figure 4:
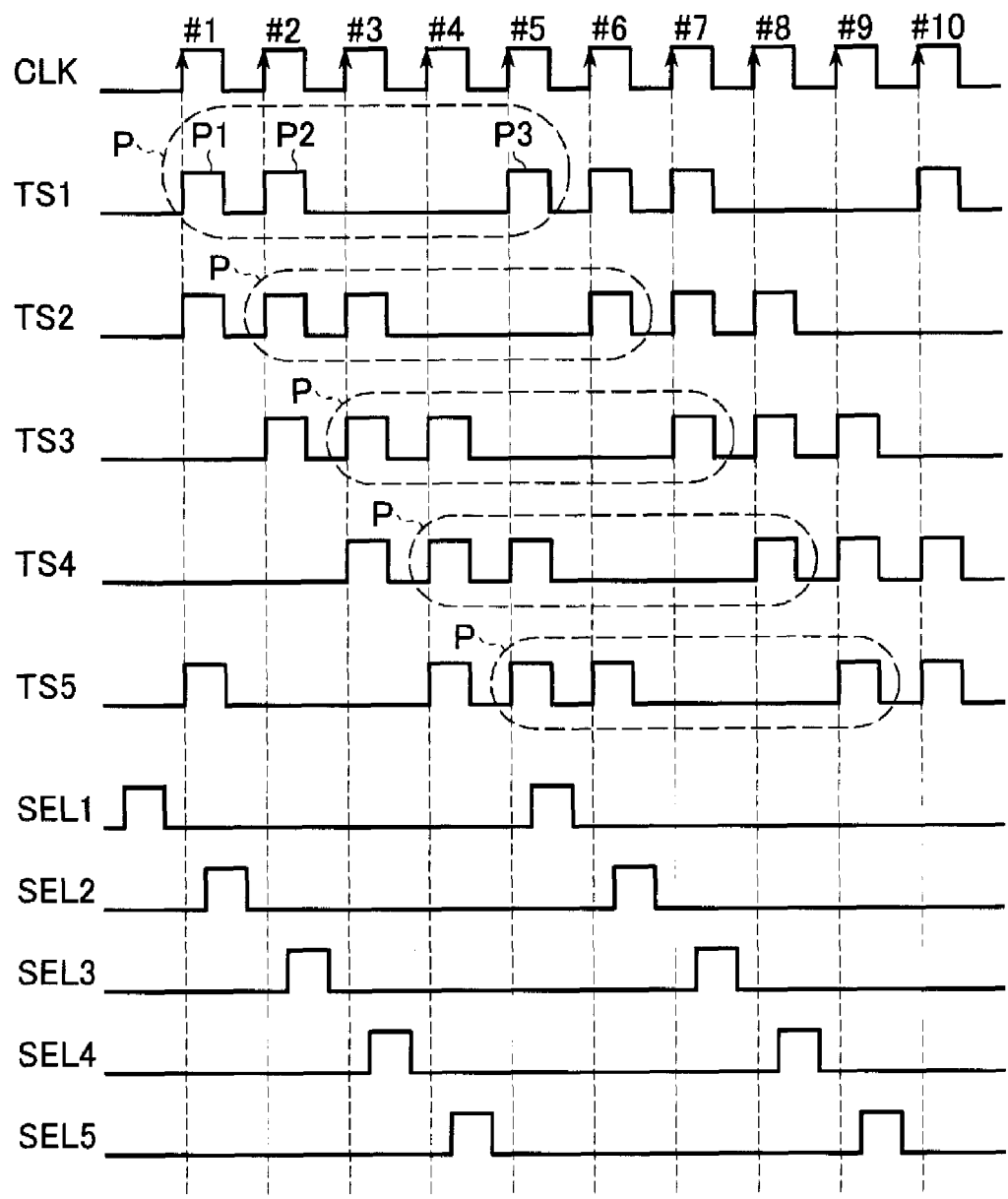
FIG. 4 is a waveform view of waveforms of the timing signals TS1 to TS5 and the timing selection signals SEL1 to SEL5.

FIG. 4 is a waveform view of waveforms of the timing signals TS1 to TS5 and the timing selection signals SEL1 to SEL5.

As shown in FIG. 4, the timing signals TS1 to TS5 are signals synchronized with the clock signal CLK and different in phase by j cycles of the clock signal, respectively. In the embodiment, j is set to 1, i.e., j=1, so that phases of the timing signals TS1 to TS5 are shifted by one clock cycle, respectively.

Each of the timing signals TS1 to TS5 has a waveform in which three pulses repeatedly appear. By way of example, the timing signal TS1 will be described specifically. A pulse group P including pulses P1 to P3 synchronized with active edges #1, #2, and #5 of the clock signal CLK, respectively repeatedly appears in the waveform of the timing signal TS1. Due to this, one pulse group P uses a five-clock cycles. Therefore, by shifting the phases of the timing signals TS1 to TS5 by one cycle of the clock signal, respectively, every active edge of the clock signal CLK corresponds to a start timing of any one of the pulse groups P appearing in the waveforms of the respective timing signals TS1 to TS5. In the example shown in FIG. 6, the active edges #1 to #5 of the clock signal CLK correspond to start timings of the pulse groups P of the respective timing signals TS1 to TS5. Furthermore, active edges #6 to #10 of the clock signal CLK similarly correspond to start timings of the pulse groups P of the respective timing signals TS1 to TS5.

The period from the pulse P1 to the pulse P3 corresponds to the period to crystallize the phase change material (the set operation), which are four cycles in the embodiment. The period from the pulse P1 to the pulse P2 corresponds to the period to make the phase change material amorphous (the reset operation), which are one cycle in the embodiment.

As shown in FIG. 4, each of the timing selection signals SEL1 to SEL5 has a one-shot-pulse waveform prior to start of the pulse groups P of the respective timing signals TS1 to TS5. Therefore, phases of the timing selection signals SEL1 to SEL5 are shifted by one cycle, respectively and the timing selection signals SEL1 to SEL5 are activated at intervals of five cycles.

A circuit configuration of each of the write control circuits WC (WC1 to WCn) is explained next.

Figure 5:
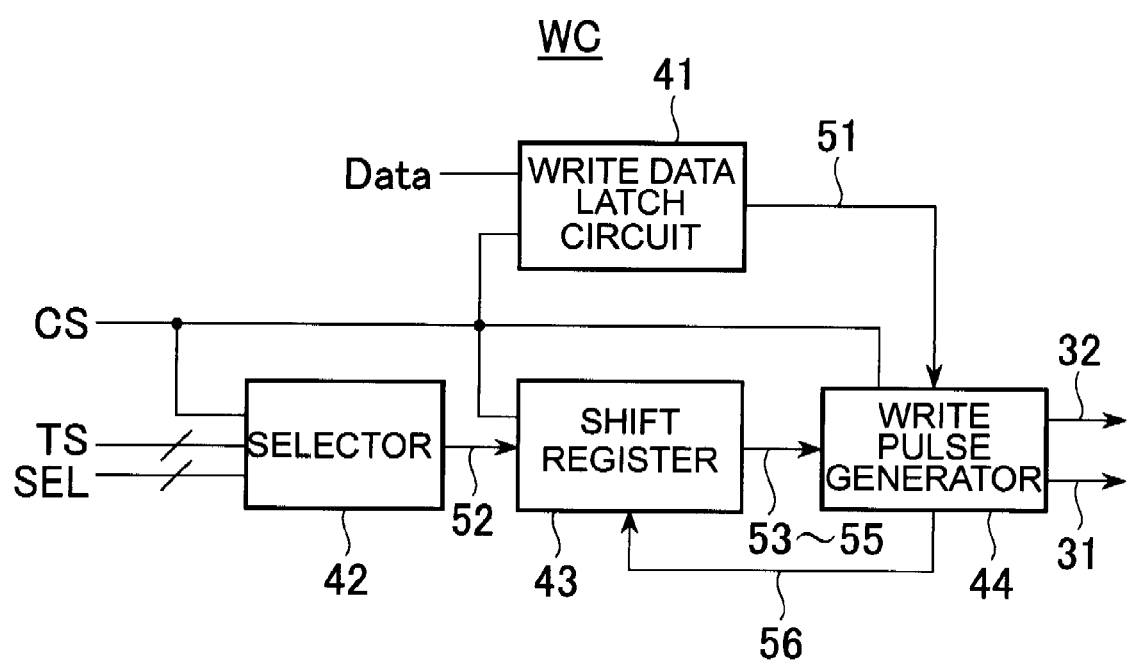
FIG. 5 is a block diagram showing a configuration of the write control circuits WC (WC1 to WCn)

FIG. 5 is a block diagram showing a configuration of the write control circuits WC (WC1 to WCn).

As shown in FIG. 5, each write control circuit WC is configured to include a write data latch circuit 41, a selector 42, a shift register 43, and a write pulse generator 44. Among the signals supplied to the write control circuit WC, the write data 'Data' is supplied to the write data latch circuit 41 and the timing signal TS and the timing selection signal SEL are supplied to the selector 42. The column selection signal CS (which is one of CS1 to CSn) is supplied to all the blocks 41 to 44.

Figure 6:
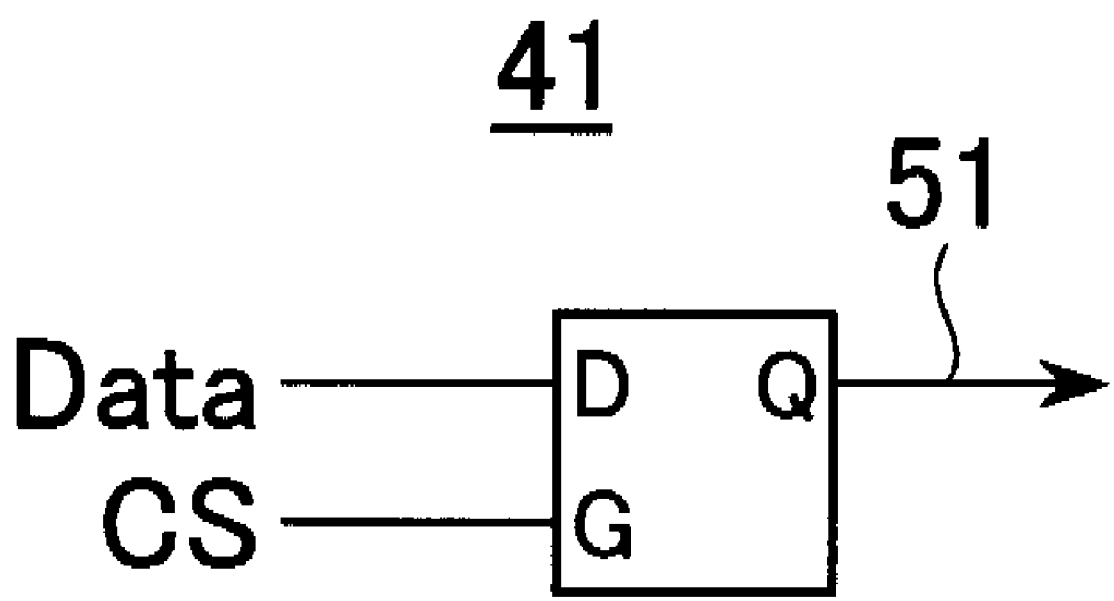
FIG. 6 is a circuit diagram of the write data latch circuit 41.

FIG. 6 is a circuit diagram of the write data latch circuit 41.

As shown in FIG. 6, the write data latch circuit 41 is constituted by a so-called transparent latch circuit (or through latch circuit). The transparent latch circuit includes two input terminals D and G. The transparent latch circuit latches a signal supplied to the input terminal D at a timing at which a signal supplied to the input terminal G changes from low level to high level. During a period in which the signal supplied to the input terminal G is at high level, the transparent latch circuit outputs the latched logical level from an output terminal Q. When the signal supplied to the input terminal G changes to the low level, the transparent latch circuit outputs the signal supplied to the input terminal D from the output terminal Q as it is. Namely, the input signal supplied to the input terminal D passes through the transparent latch circuit if the signal supplied to the input terminal G is at low level.

As shown in FIG. 6, the write data 'Data' is supplied to the input terminal D and the corresponding column selection signal CS (which is one of CS1 to CSn) is supplied to the input terminal G. The signal output from the output terminal Q is supplied to the write pulse generator 44 as an internal signal 51.

Figure 7:
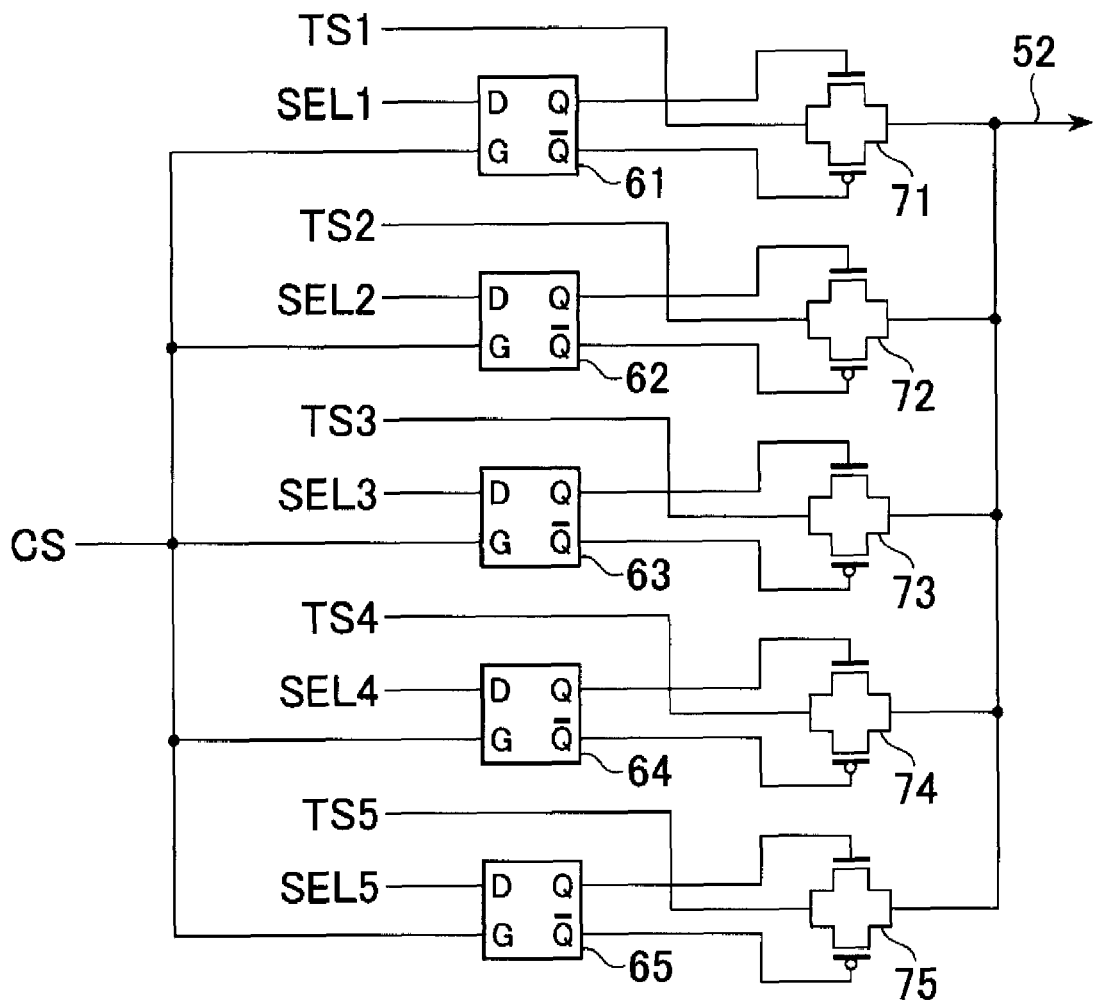
FIG. 7 is a circuit diagram of the selector 42.

FIG. 7 is a circuit diagram of the selector 42.

As shown in FIG. 7, the selector 42 is configured to include five transparent latch circuits 61 to 65 and five transfer gates 71 to 75 corresponding to the transparent latch circuits 61 to 65, respectively. The transparent latch circuits 61 to 65 function similarly to the write data latch circuit 41 that is the transparent latch circuit as described above.

The timing selection signals SEL1 to SEL5 are supplied to input terminals D of the transparent latch circuits 61 to 65, respectively. Further, one corresponding column selection signal CS (which is one of CS1 to CSn) is supplied to the input terminals G of the transparent latch circuits 61 to 65 in common.

Moreover, the timing signals TS1 to TS5 are supplied to input terminals of the transfer gates 71 to 75, respectively. The transfer gates 71 to 75 are controlled to operate by signals output from the respective transparent latch circuits 61 to 65. When the output terminals Q of the corresponding transparent latch circuits 61 to 65 become high level and inverted output terminals/Q thereof become low level, the timing signals TS1 to TS5 pass through the corresponding transfer gates 71 to 75, respectively. Outputs of the transfer gates 71 to 75 are connected in common and supplied to the shift register 43 as an internal signal 52.

With such a circuit configuration, if the corresponding column selection signal CS (which is one of CS1 to CSn) changes from low level to high level, the transparent latch circuits 61 to 65 latch the timing selection signals SEL1 to SEL5, respectively. Accordingly, one of the transparent latch circuits 61 to 65 latches the high level to thereby turn on one of the corresponding transfer gates 71 to 75. Therefore, the output internal signal 52 has the same waveform as that of one of the timing signals TS1 to TS5.

Figure 8:
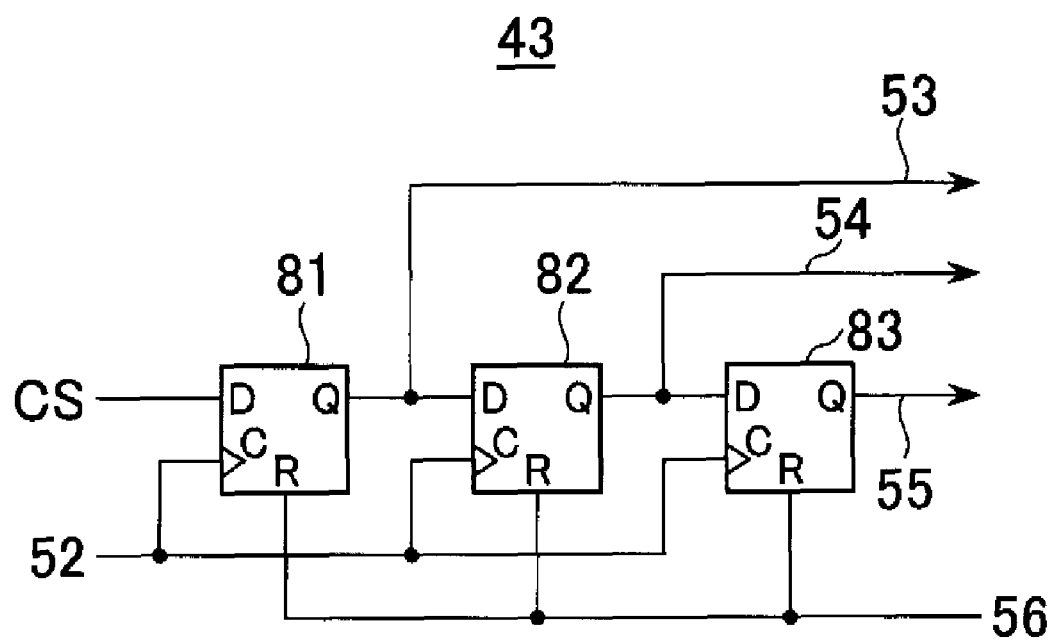
FIG. 8 is a circuit diagram of the shift register 43.

FIG. 8 is a circuit diagram of the shift register 43.

As shown in FIG. 8, the shift register 43 is configured to include three reset-function-added latch circuits 81 to 83. Each of the reset-function-added latch circuits 81 to 83 loads a signal supplied to an input terminal D at a timing at which a signal supplied to a clock terminal C changes from low level to high level, and outputs the loaded signal from an output terminal Q. Further, when a signal supplied to a reset terminal R becomes high level, the latched data is reset to zero.

The three reset-function-added latch circuits 81 to 83 are cascaded to one another as shown in FIG. 8, and one corresponding column selection signal CS (which is one of CS1 to CSn) is supplied to the input terminal D of the latch circuit 81 in the first stage. The internal signal 52 is supplied to the clock terminals C of the reset-function-added latch circuits 81 to 83 in common, and an internal signal 56, to be described later, is supplied to the reset terminals R thereof in common.

The signals output from the output terminals Q of the reset-function-added latch circuits 81 to 83 are supplied to the write pulse generator 44 as internal signals 53 to 55, respectively.

Figure 9:
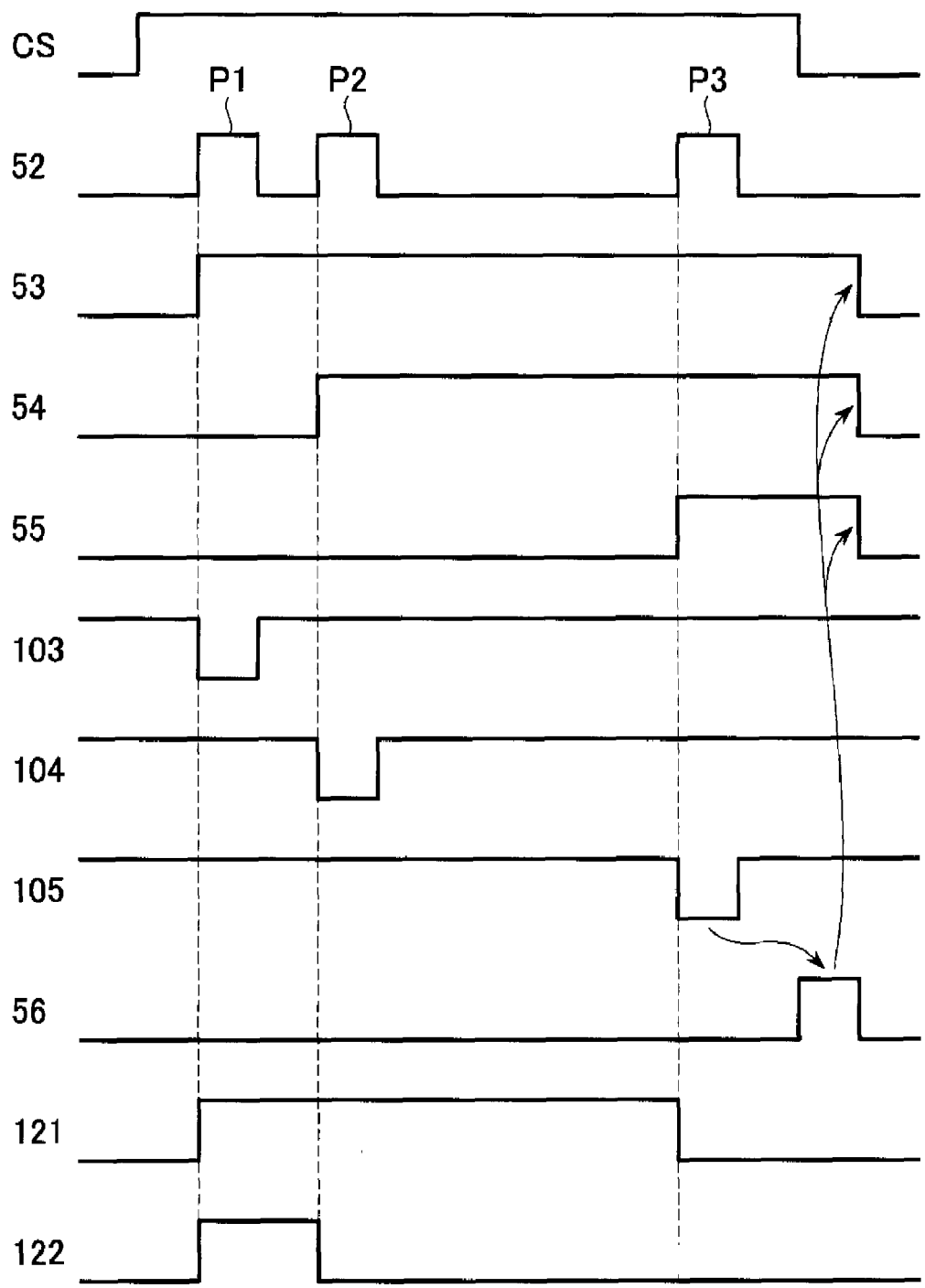
FIG. 9 is waveforms of various internal signals.

Waveforms of the internal signals 53 to 55 are shown in FIG. 9.

As described above, the internal signal 52 supplied to the clock terminals C has the same waveform as that of one of the timing signals TS1 to TS5. Due to this, the internal signal 52 includes three pulses P1 to P3 as shown in FIG. 9. Accordingly, the level of the column selection signal CS (which is one of CS1 to CSn) is sequentially loaded to the reset-function-added latch circuits 81 to 83 synchronously with the pulses P1 to P3, respectively. Therefore, the internal signals 53 to 55 sequentially become high level synchronously with the pulses P1 to P3, respectively.

Figure 10:
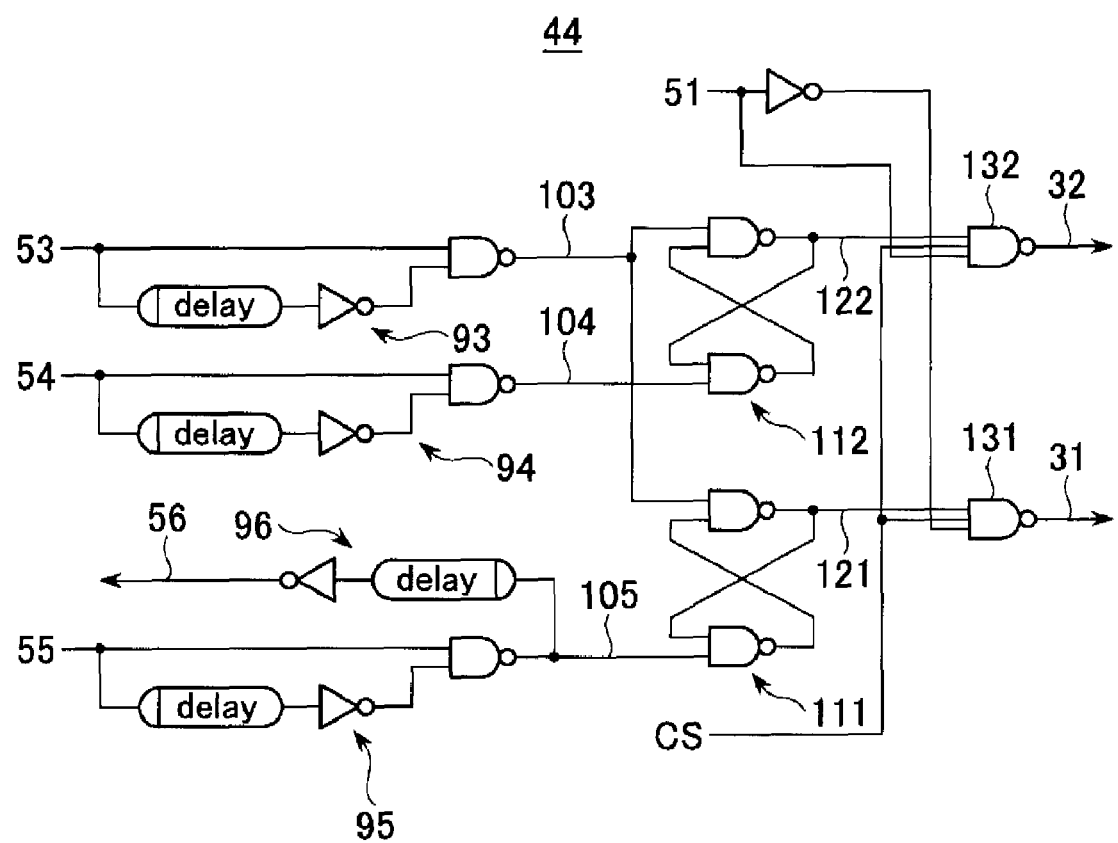
FIG. 10 is a circuit diagram of the write pulse generator 44.

FIG. 10 is a circuit diagram of the write pulse generator 44.

As shown in FIG. 10, the write pulse generator 44 is configured to include one-shot-pulse generators 93 to 95 receiving the internal signals 53 to 55 and generating one-shot pulses 103 to 105, respectively, an SR latch 111 receiving the one-shot pulses 103 and 105, and an SR latch 112 receiving the one-shot pulses 103 and 104.

The one-shot-pulse generators 93 to 95 are configured to include delay elements delaying the corresponding internal signals 53 to 55, inverters inverting outputs of the delay elements, and NAND circuits receiving the corresponding internal signals 53 to 55 and output of the inverters, respectively. With such a configuration, as shown in FIG. 9, the one-shot-pulse generators 93 to 95 generate the one-shot pulses 103 to 105 becoming low level by as much as delays at timings at which the corresponding internal signals 53 to 55 change from low level to high level, respectively.

The write pulse generator 44 is configured to also include a reset circuit unit 96 generating the internal signal 56 from the one-shot pulse 105. The reset circuit unit 96 is configured to include a delay element delaying the one-shot pulse 105 and an inverter inverting an output of the delay element. A waveform of the internal signal 56 generated by the reset circuit unit 96 is shown in FIG. 9 and is a one-shot-pulse waveform shifted by as much as a delay. As shown in FIG. 8, the internal signal 56 is supplied to the reset terminals R of the reset-function-added latch circuits 81 to 83 to reset the latched data to zero.

The SR latch 111 is a circuit that is set when the one-shot pulse 103 is activated and that is reset when the one-shot pulse 105 is activated. The SR latch 112 is a circuit that is set when the one-shot pulse 103 is activated and that is reset when the one-shot pulse 104 is activated. Accordingly, waveforms of internal signals 121 and 122 output from the respective SR latches 111 and 112 are those shown in FIG. 9. Namely, the internal signal 121 output from the SR latch 111 is at high level over the period from the pulse P1 to the pulse P3, i.e., over the period of $k_1$ cycles of the clock signal. The internal signal 122 output from the SR latch 112 is at high level over the period from the pulse P1 to the pulse P2, i.e., over the period of $k_2$ cycles of the clock signal.

As shown in FIG. 10, the internal signals 121 and 122 are supplied to NAND circuits 131 and 132, respectively. Besides the internal signal 121, one corresponding column selection signal CS (which is one of CS1 to CSn) and an inverted signal of the internal signal 51 are supplied to the NAND circuit 131. Besides the internal signal 122, one corresponding column selection signal CS (which is one of CS1 to CSn) and the internal signal 51 are supplied to the NAND circuit 132. As described with reference to FIG. 6, the internal signal 51 is the write data 'Data' latched by one corresponding column selection signal CS (which is one of CS1 to CSn).

With such a circuit configuration, when the write data 'Data' is at low level, the NAND circuit 131 generates the set pulse 31 synchronously with the internal signal 121. On the other hand, when the write data 'Data' is at high level, the NAND circuit 132 generates the reset pulse 32 synchronously with the internal signal 122.

The circuit configurations of the principal parts of the semiconductor memory device according to the embodiment have been described so far. A write control operation performed on the semiconductor memory device according to the embodiment is explained next.

Figure 11:
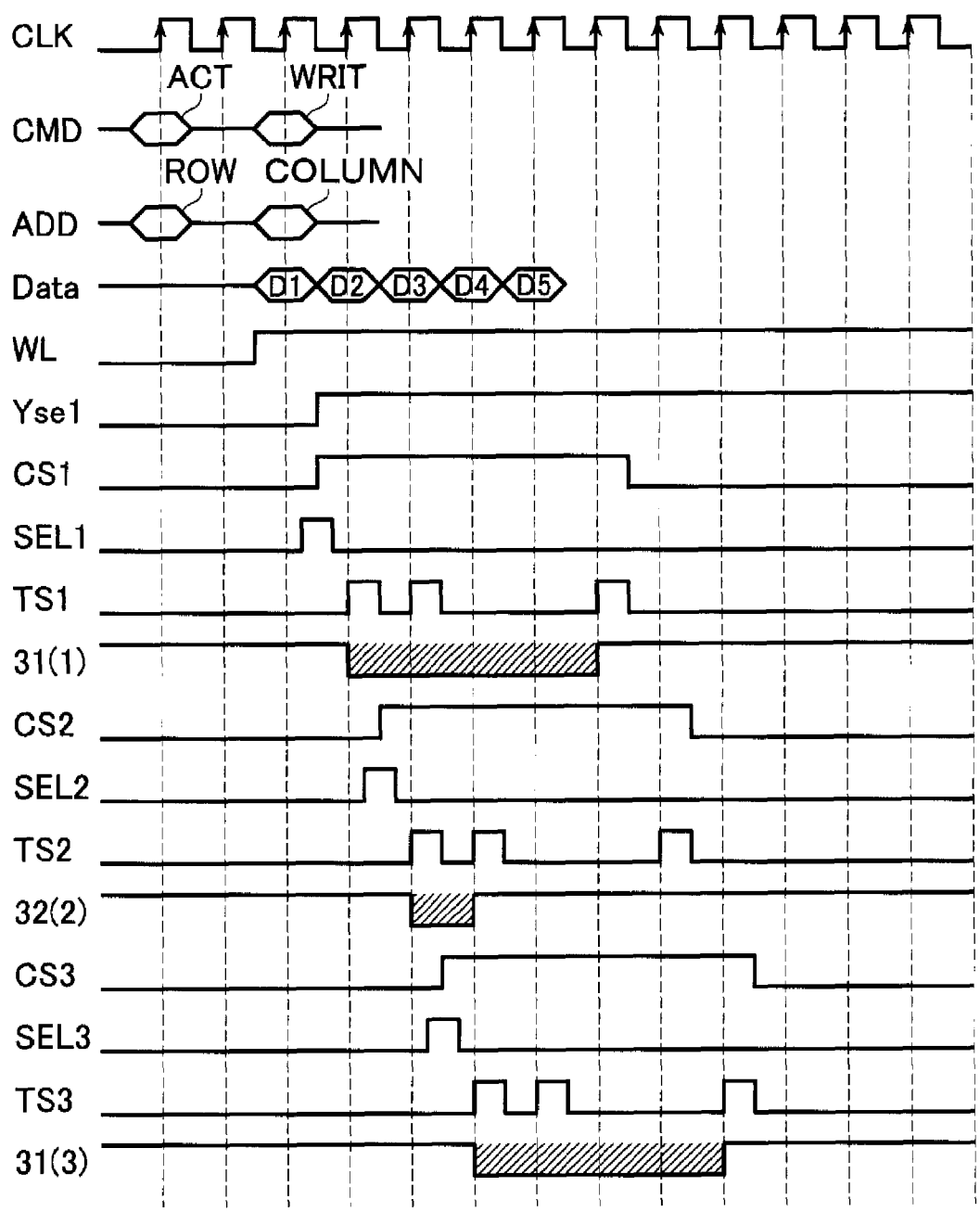
FIG. 11 is a timing chart for explaining the write control operation according to the embodiment.

FIG. 11 is a timing chart for explaining the write control operation according to the embodiment. In FIG. 11, only parts of the timing signals TS1 to TS5 and the timing selection signals SEL1 to SEL5 actually used for the write operation are shown and the pulses before and after the parts are not shown for facilitating visualization of FIG. 11.

As shown in FIG. 11, when a row address is supplied in response to an external ACT command and a column address (indicating BL1, here) is supplied in response to an external WRIT command, a word line WL corresponding to the row address is activated and the selection signal Ysel is activated in response to the supply of the row address and the column address. The write data 'Data' is continuously supplied from the outside synchronously with the clock signal CLK.

The column selection signals CS1, CS2, CS3 . . . corresponding to write data D1, DS2, DS3 . . . , respectively, are sequentially activated, whereby the timing signals TS1, TS2, TS3 . . . are selected in the write control circuits WC1, WC2, WC3 . . . , respectively. As described above, the selection of the timing signals TS1 to TSn is made by the selectors 42 in the respective write control circuits WC1 to WCn.

In the example shown in FIG. 11, out of the write data 'Data', the first and third data D1 and D3 are "0" and the second data D2 is "1". Due to this, the write control circuits WC1 and WC3 activate the set pulse 31 over the period from the pulse P1 to the pulse P3, i.e., over the period of four cycles of the clock signal ($=k_1$) synchronously with the timing signals TS1 and TS3, respectively. The write control circuit WC2 activates the reset pulse 32 over the period from the pulse P1 to the pulse P2, i.e., over the period of one cycle ($=k_2$) synchronously with the timing signal TS2. In FIG. 11, the period in which the set pulse 31 or the reset pulse 32 is active is hatched.

By doing so, the bit lines BL1 and BL3 are connected to the set potential line Vset over the period of four cycles of the clock signal. This gives a temperature history represented by the curve b shown in FIG. 3 to the nonvolatile memory element PC included in each of the memory cells MCs connected to the bit lines BL1 and BL3. As a result, the phase change material is crystallized. On the other hand, the bit line BL2 is connected to the reset potential line Vreset over the period of one cycle. This gives a temperature history represented by the curve a shown in FIG. 3 to the nonvolatile memory element PC included in each of the memory cells MCs connected to the bit line BL2. As a result, the phase change material is turned into the amorphous phase.

In this manner, in the state in which a word line WL corresponding to the row address is activated, the column selector 12 is used to sequentially select a write control circuit per clock cycle, the set current is applied to the memory cells MCs to be crystallized over the four-clock cycles, and the reset current is applied to the memory cells MCs to be made amorphous over the one-clock cycle. By doing so, it appears from the outside that one write operation ends in the one-clock cycle irrespectively of the logical level of the write data 'Data'. It is, therefore, possible to ensure compatibility with the memory performing write operations synchronously with the clock signal CLK similarly to the synchronous DRAM.

Moreover, the semiconductor memory device according to the embodiment employs the timing signals TS1 to TS5. Due to this, even if a frequency of the clock signal CLK is increased, a pulse width of the set pulse can be secured. For example, if the frequency of the clock signal CLK is increased twofold, an actual pulse width of the set pulse can be secured by doubling the number of cycles of the clock signal from the pulse P1 to the pulse P3. Therefore, irrespectively of the frequency of the clock signal CLK, it is possible to accurately execute the set operation and the reset operation.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, in the above embodiment, the set operation is performed over the period from the pulse P1 to the pulse P3 specifying $k_1$ cycles of the clock signal, and the reset operation is performed over the period from the pulse P1 to the pulse P2 specifying $k_2$ cycles of the clock signal. However, a method of specifying the period for performing the set operation or reset operation is not limited to that described in the embodiment.

Figure 12:
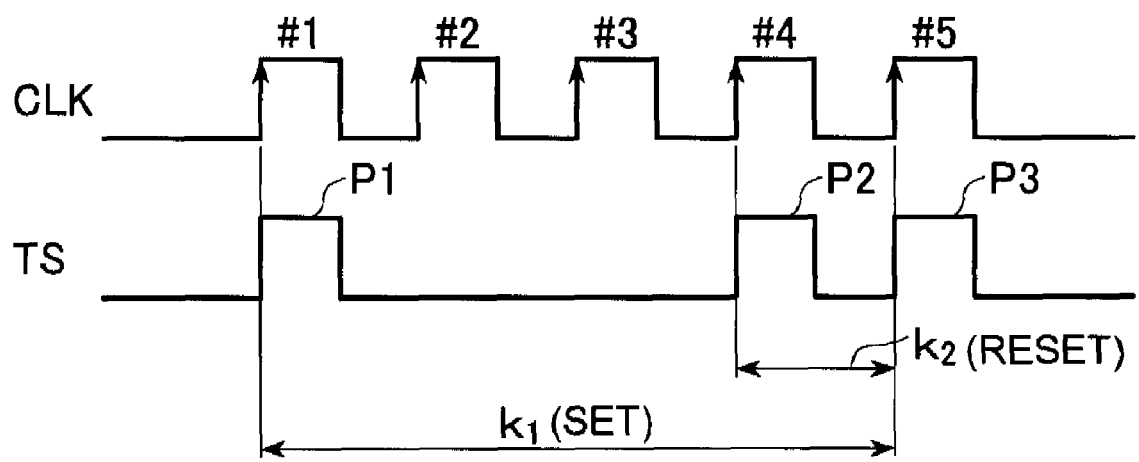
FIG. 12 is a waveform of one alternative of the timing signal TS.

As one alternative, as shown in FIG. 12, the set operation may be performed over the period from the pulse P1 to the pulse P3 specifying $k_1$ cycles of the clock signal and the reset operation may be performed over the period from the pulse P2 to the pulse P3 specifying $k_2$ cycles of the clock signal using a pulse group including the pulses P1 to P3 synchronized with the active edges #1, #4, and #5 of the clock signal CLK, respectively.

Figure 13:
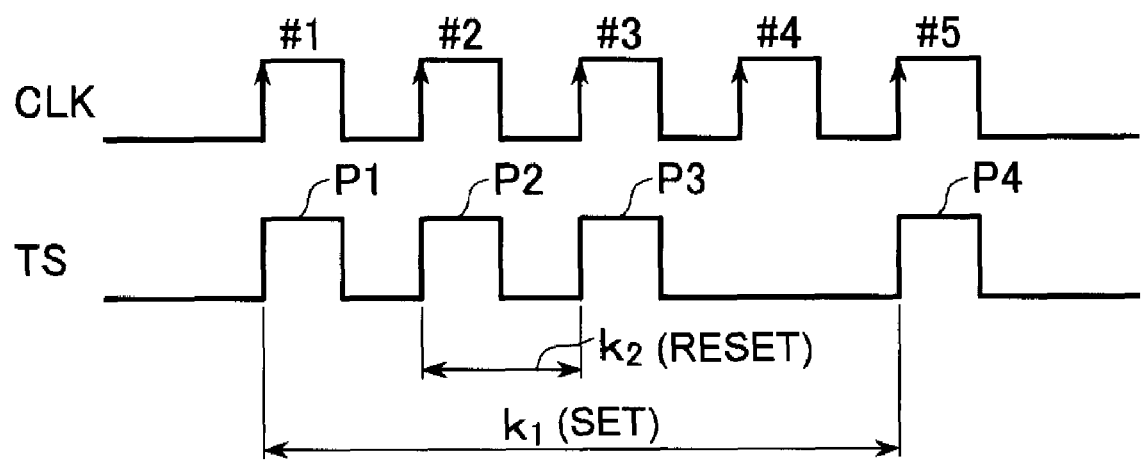
FIG. 13 is a waveform of another alternative of the timing signal TS.

In another alternative, as shown in FIG. 13, the set operation may be performed over the period from the pulse P1 to the pulse P4 specifying $k_1$ cycles of the clock signal and the reset operation may be performed over the period from the pulse P2 to the pulse P3 specifying $k_2$ cycles of the clock signal using a pulse group including the pulses P1 to P4 synchronized with the active edges #1, #2, #3, and #5 of the clock signal CLK, respectively.

Figure 14:
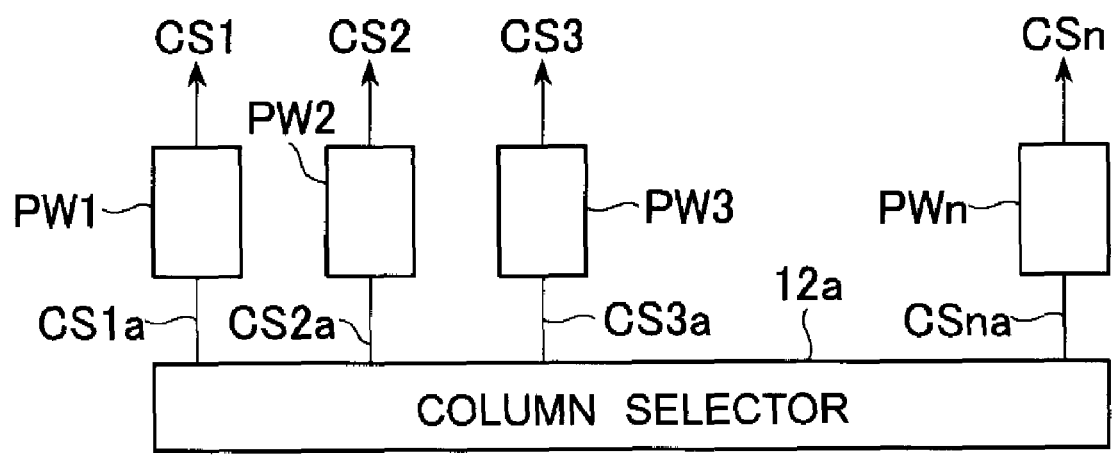
FIG. 14 is a block diagram of a circuit according to an example where the column selection signals CS1 to CSn are generated.

Furthermore, in the above embodiment, the column selector 12 itself generates the column selection signals CS1 to CSn to be activated in parallel. However, the column selector 12 may generate only timing signals serving as start points of activating the column selection signals CS1 to CSn and the column selection signals CS1 to CSn having a predetermined width may be generated by expanding the respective timing signals. FIG. 14 is a block diagram of a circuit necessary for such an operation and FIG. 15 is a timing chart of the operation up to n=5.

The circuit shown in FIG. 14 is configured to include a column selector 12a and pulse width adjustment circuits PWT to PWn. The column selector 12a is a circuit generating original signals CS1a to CSna. The original signals CS1a to CSna are expanded by the pulse width adjustment circuits PW1 to PWn, thereby generating the column selection signals CS1 to CSn, respectively.

Figure 15:
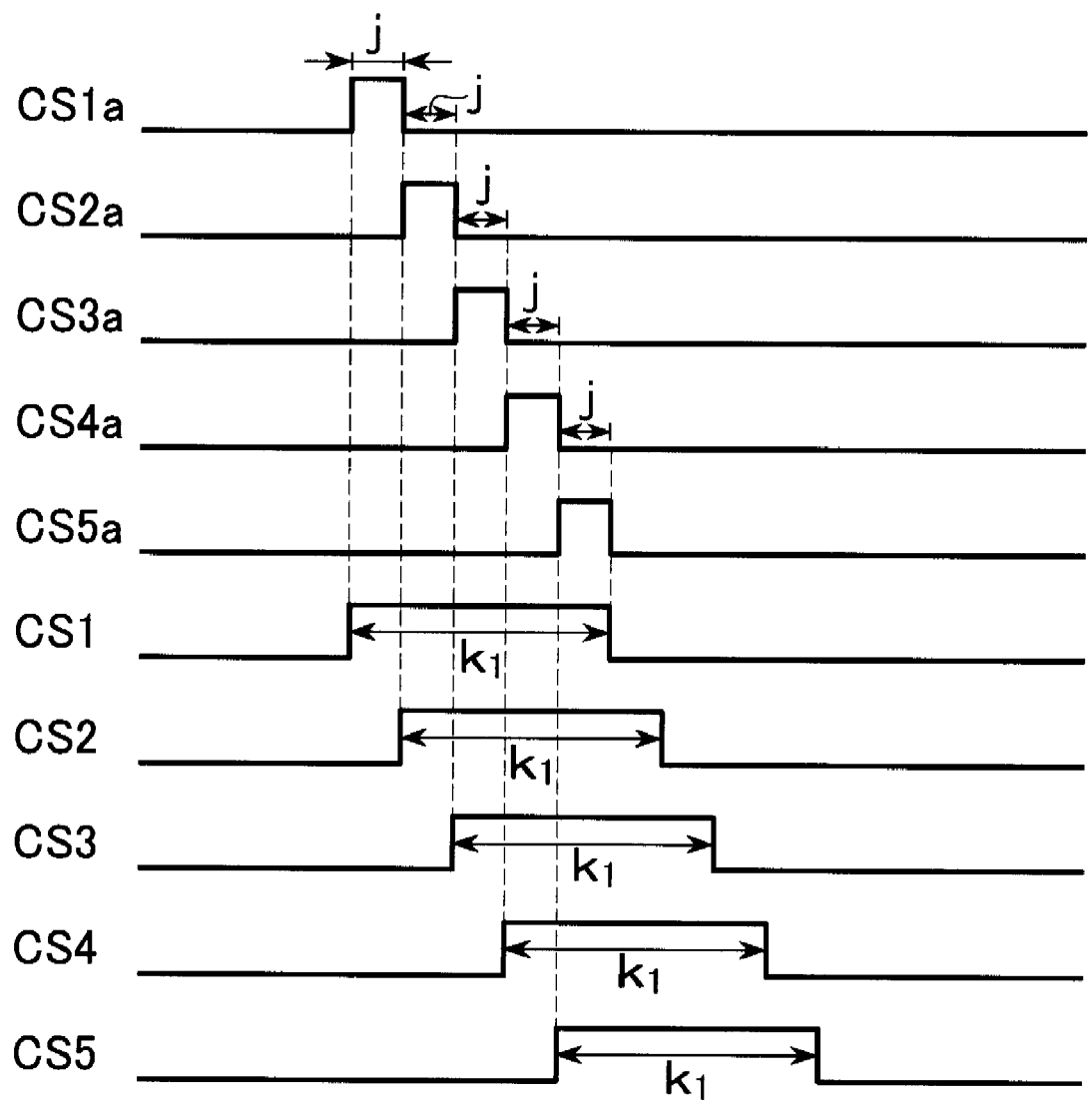
FIG. 15 is a timing chart for explaining the operation of the circuit shown in FIG. 14.

As shown in FIG. 15, the original signals CS1a to CSna (which are CS1a to CS5a shown in FIG. 15) generated by the column selector 12a are activated at intervals of j cycles of the clock signal and a pulse width of each of the original signals CS1a to CSna is also j cycles of the clock signal. Namely, the original signals CS1a to CSna are exclusively activated, and two or more original signals are not activated in parallel. The pulse width adjustment circuits PW1 to PWn receiving these original signals CS1a to CSna start activating the column selection signals CS1 to CSn in response to activation of the corresponding original signals CS1a to CSna and maintain the column selection signals CS1 to CSn active over a period of $k_1$ cycles of the clock signal.

If the column selection signals CS1 to CSn are generated by this method, the operations performed by the column decoder 12a and the like can be accelerated. This can also facilitate circuit designing.

Moreover, in the embodiment, symbol j is set to 1, i.e., j=1 and a write control circuit is sequentially selected per 1 clock cycle. However, if write data is supplied synchronously with both edges of the clock signal CLK as performed in a DDR synchronous DRAM, then j may be set to 0.5, i.e., j=0.5 and a write control circuit may be selected per 0.5 clock cycle. In other words, symbol j is not necessarily an integer.

Figure 16:
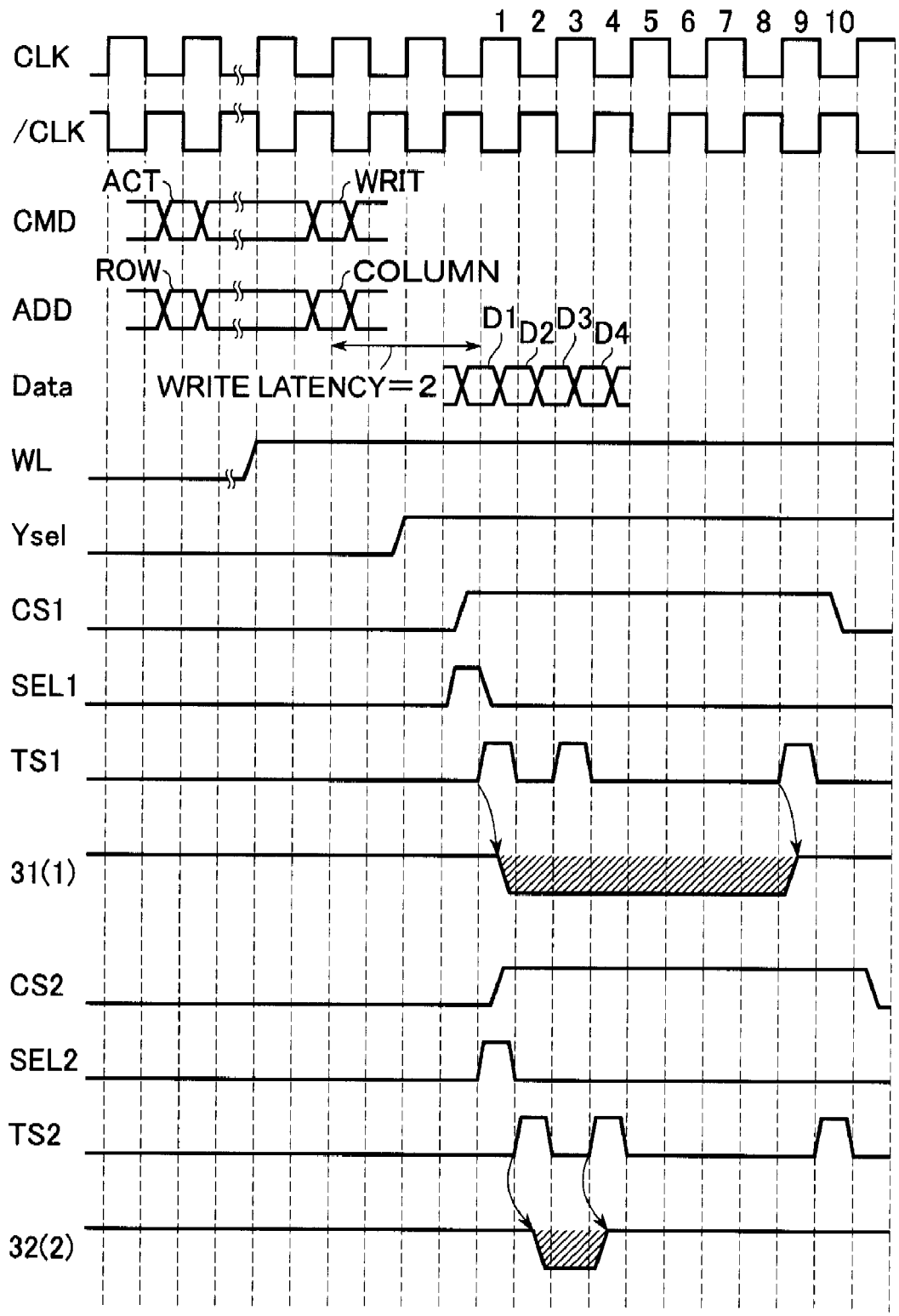
FIG. 16 is a timing chart of an example of the operation if j is set to 0.5.

FIG. 16 is a timing chart of an example of the operation if j is set to 0.5, i.e., j=0.5 and of the example in which write latency is set to two cycles of the clock signal. In the example shown in FIG. 16, the pulse P1 of the timing signal TS1 is synchronized with a half cycle #1 of the clock signal CLK, the pulse P2 is synchronized with a half cycle #3, and the pulse P3 is synchronized with a half cycle #9. If such timing signals TS1 to TSn are generated while being shifted each by a half cycle, it is possible that it appears from the outside that the semiconductor memory device operates similarly to the DDR synchronous DRAM.

While the embodiment has explained an example in which the present invention is applied to a PRAM using phase change elements, the present invention is not limited thereto. The present invention can be also applied to other types of memory device using variable resistance elements in which the resistance value can be changed by applying a voltage pulse as well as the phase change element, such as a RRAM.

What is claimed is:

1. A semiconductor memory device comprising:
   a word line;
   a bit line intersecting the word line;
   a memory element arranged at intersections of the word line and the bit line and having different required time for a write operation according to a logical value of write data;
   a write driver supplying a write current to the bit line;
   a write control circuit controlling operations of the write driver; and
   a timing signal generation circuit supplying a timing signal to the write control circuit,
   wherein the timing signal has a waveform including a pulse indicating a time of starting supplying the write current when a first logical level is to be written, a pulse indicating a time of ending supplying the write current when the first logical level is to be written, and a pulse indicating one of a time of starting supplying the write current and a time of ending supplying the write current when a second logical level is to be written.

2. The semiconductor memory device as claimed in claim 1, wherein the timing signal has a waveform including a first pulse indicating a time of starting supplying the write current, a second pulse indicating a time of ending supplying the write current when the second logical level is to be written, and a third pulse indicating a time of ending supplying the write current when the first logical level is to be written.

3. The semiconductor memory device as claimed in claim 2, wherein the write driver includes a first transistor and a second transistor,
   the write control circuit brings the first transistor into a conductive state over a period from the first pulse to the third pulse when the first logical level is to be written, and brings the second transistor into a conductive state over a period from the first pulse to the second pulse when the second logical level is to be written.

4. The semiconductor memory device as claimed in claim 1, wherein the bit line is one of a plurality of bit lines, the write driver is one of a plurality of write drivers that corresponds to a plurality of bit lines, respectively, and the write control circuit is one of a plurality of write control circuits that corresponds to a plurality of write drivers, respectively,
   the timing signal generation circuit supplies a plurality of timing signals having different phases one another to the write control circuits in common.

5. The semiconductor memory device as claimed in claim 4, further comprising a column selector selecting at least one of the write control circuits,
   wherein the timing signal generation circuit supplying a plurality of timing selection signals having different phases one another to the write control circuits in common,
   each of the write control circuits selects one of the timing signals based on the timing selection signal which is activated when a selection is implemented by the column selector.

6. The semiconductor memory device as claimed in claim 1, wherein the memory element is a nonvolatile memory element includes a variable resistance material.

7. The semiconductor memory device as claimed in claim 6, wherein the variable resistance material is a phase change material.

8. The semiconductor memory device as claimed in claim 7, wherein the first logical level is written through bringing the phase change material included in the nonvolatile memory element into a crystalline phase and the second logical level is written through bringing the phase change material included in the nonvolatile memory element into an amorphous phase.

9. A semiconductor memory device comprising:
   one or more memory cells having different required time for a write operation according to a logical value of write data;
   a timing signal generation circuit generating a plurality of timing signals having different phases, respectively; and
   a write control circuit performing the write operation based on one of the timing signals and on the logical value of the write data,
   wherein the timing signal has a waveform including a pulse indicating a time of starting supplying the write current when a first logical level is to be written, a pulse indicating a time of ending supplying the write current when the first logical level is to be written, and a pulse indicating one of a time of starting supplying the write current and a time of ending supplying the write current when a second logical level is to be written.

10. The semiconductor memory device as claimed in claim 9, wherein the timing signals have a waveform including a first pulse indicating a time of starting supplying the write current, a second pulse indicating a time of ending supplying the write current when the second logical level is to be written, and a third pulse indicating a time of ending supplying the write current when the first logical level is to be written.

11. The semiconductor memory device as claimed in claim 9, wherein each of the memory cells includes a nonvolatile memory element having a variable resistance material.

12. The semiconductor memory device as claimed in claim 11, wherein the variable resistance material is a phase change material.

13. The semiconductor memory device as claimed in claim 12, wherein the first logical level is written through bringing the phase change material included in the nonvolatile memory element into a crystalline phase and the second logical level is written through bringing the phase change material included in the nonvolatile memory element into an amorphous phase.

14. A write control method for a semiconductor memory device, the semiconductor memory device including a word line, a bit line intersecting the word line, a memory element arranged at intersections of the word line and the bit line and having different required time for a write operation according to a logical value of write data, a first and a second transistor supplying a write current to the bit line, the write control method comprising steps of:
   generating a timing signal having a first to a third pulse;
   bringing the first transistor into a conductive state over a period from the first pulse to the third pulse when the first logical level is to be written, and bringing the second transistor into a conductive state over a period from the first pulse to the second pulse when the second logical level is to be written.

* * * * *